United States Patent [19]
Jemison et al.

[11] Patent Number: 5,198,783
[45] Date of Patent: Mar. 30, 1993

[54] OPTICALLY CONTROLLED ACTIVE IMPEDANCE ELEMENT PARTICULARLY SUITED FOR A MICROWAVE OSCILLATOR

[75] Inventors: William D. Jemison, Ambler; Peter R. Herczfeld, Philadelphia, both of Pa.

[73] Assignee: The United States of America as represented by the Secretary of the Navy, Washington, D.C.

[21] Appl. No.: 843,677

[22] Filed: Feb. 28, 1992

[51] Int. Cl.$^5$ .............................................. H03B 5/00
[52] U.S. Cl. .................. 331/66; 331/108 R; 331/115; 331/181
[58] Field of Search ................. 331/34, 66, 74, 108 R, 331/117 R, 117 FE, 108 B, 108 C, 115, 132, 181

[56] References Cited

U.S. PATENT DOCUMENTS 3,818,370 6/1974 Abe et al. .................. 331/108 R X
4,873,497 10/1989 Kielmeyer, Jr. ................ 331/108 B

*Primary Examiner*—David Mis
*Attorney, Agent, or Firm*—James V. Tura; James B. Bechtel; Susan E. Verona

[57] ABSTRACT

An optically controlled active impedance element particularly suited to serve as a tuneable inductive element for a microwave oscillator is disclosed. The optically controlled active inductive element is comprised of a circuit arrangement, preferably consisting of MESFET devices which exhibit a composite inductive characteristics, and whose inductance may be determined and controlled by direct illumination impinging on the MESFETs. The optically controlled active inductive element lends itself to being adapted to monolithic microwave integrated circuit (MMIC) applications and may find use in a wide variety of microwave circuits. Also disclosed, is an embodiment which used the optical controlled active impedance element, in a prescribed manner, to serve as a tueable capacitor for use in various microwave circuits.

6 Claims, 5 Drawing Sheets

IMPEDANCE vs. FREQUENCY

INDUCTANCE and Q vs. LED

1/gm vs. Vgs/Vp

INDUCTANCE and Q vs. IDSF

HIGH-PASS FILTER

LOW-PASS FILTER

OPTICALLY CONTROLLED ACTIVE IMPEDANCE ELEMENT PARTICULARLY SUITED FOR A MICROWAVE OSCILLATOR

The invention described herein may be manufactured and used by and for the Government of the United States of America for Governmental purposes without payment of any royalties thereon or therefore.

BACKGROUND OF THE INVENTION

The present invention relates to microwave circuits and, more particularly, to an optical controlled active impedance element which in one embodiment may serve as a tuneable inductive element for various microwave circuits and, in another embodiment, may serve as a tuneable capacitative element in similar microwave circuits.

A standard technique for controlling microwave circuits, such as an oscillator, involves the direct illumination of either an active semiconductive device comprising the oscillator or an active tuning element located at an output port of the oscillator. The incident light associated with the illumination is absorbed in the semiconductor device which alters the device characteristics through a combination of photoconductive, photovoltaic and phototransistor effects. The specific effects are dependent on the particular device technology being used and its related structure. The particular technology may be of the family of devices having the commonly used identifiers such as MESFETs, BJT, HBT and HEMT that are particularly suited for microwave applications. In general, however, the changes in the equivalent circuit parameters of the device may be used to account for the various photoeffects. The equivalent circuit parameters which are optically sensitive, include the device capacitance associated with the rectifying junctions, transconductance, and the parasitic resistances. Therefore, it is known that, frequency tuning may be accomplished by optical induced capacitive changes, and pulse modulation may be accomplished by optically induced transconductive changes.

The oscillators whose operation is determined by these capacitive and transconductive changes have several limitations and attendant disadvantages. For example, since these capacitive and transconductive effects occur simultaneously in response to the same incident light, there is usually output power variations occurring while frequency tuning is being accomplished. More particularly, the incident light causes power variations (transconductive changes) during the same time that frequency tuning (capacitive changes) is occurring. In addition, the frequency tuning range, that is, the frequency range of tuneable oscillators, is limited by the capacitive changes that can be optically induced. Furthermore, for pulsed-typed oscillators, the transient response may be extremely slow since this response is directly related to excess carrier dynamics of the semiconductor device (e.g., MESFET) which may have relatively long lifetimes due to the "traps" in the illuminated device. Still further, direct illumination of the optically responsive element of the oscillator may also impose significant optical power requirements due to light coupling limitation and the need to control the device over a wide dynamic range for pulsed operation. It is desired that optically sensitive devices be provided for microwave circuits, such as oscillators, that do not have these prior art limitations and attendant disadvantages.

SUMMARY OF THE INVENTION

The present invention is directed to an optically controlled impedance element preferably comprised of field effect transistors at least one of which is sensitive and responsive to an impinging optical signal. The present invention does not suffer from the prior art problems associated with excess carrier dynamics of semiconductor devices and requires less incident light to operate so as to reduce the optical power needed for its operation relative to the prior art devices. Furthermore, the invention provides significant improvements in the range of frequencies to which microwave devices, such as an oscillator, may be tuned.

The present invention is particularly suited as an optically tuned active impedance element for an oscillator. The optically controlled active impedance element is responsive to low power optical signals so that the optical power normally required for pulse operation is reduced relative to other prior art devices. This optical power requirement reduction is also applicable to frequency tuning applications.

The present invention provides for significant improvement in the pulsed-typed operations by selecting the operating point of the optically controlled device so that only a relative amount of incidence light is needed to cause the oscillator circuit to switch between its stable and oscillating conditions. The transient response improvement yielded by the principles of the present invention is significantly greater than the transient response of prior art devices commonly being in the millisecond range due to their reliance on excessive carrier dynamics. The present invention also yields an increase in the tuning range by providing an optically controlled active device that acts as an inductive element.

Accordingly, it is an object of the present invention, to provide an optically controlled active impedance element serving as an inductive device to provide improvements in the frequency tuning range of microwave circuits.

It is a further object of the present invention, to provide an optically controlled active impedance element that is responsive to lower levels of incidence light so as to reduce the optical power required for microwave circuits such as oscillators and pulse modulated circuits.

Further, it is an object of present invention to provide optically controlled active element that improves the response of an optically controlled oscillator.

Further still, is an object of the present invention to provide for various circuits, such as low-pass and high-pass filters suited for microwave applications.

Other objects, advantages and novel features of the invention will be become apparent from the following detailed description of the invention when considered in conjunction with the accompanying drawings wherein.

DETAILED DESCRIPTION OF THE PREFERRED EMBODIMENTS

The present invention provides for an optically controlled active impedance element having a first embodiment that acts as an inductive element, and a second embodiment that acts as a capacitive element. The optically controlled active impedance element provides the means for reducing the normal required optical power for pulse operations of microwave circuits. Further, the optically controlled active impedance element improves the transient response of pulsed-typed microwave circuits. Still further, the optically controlled active impedance element when operated so as to serve as a inductive element, increases the tuning range of optically responsive microwave circuits.

Figure 1:
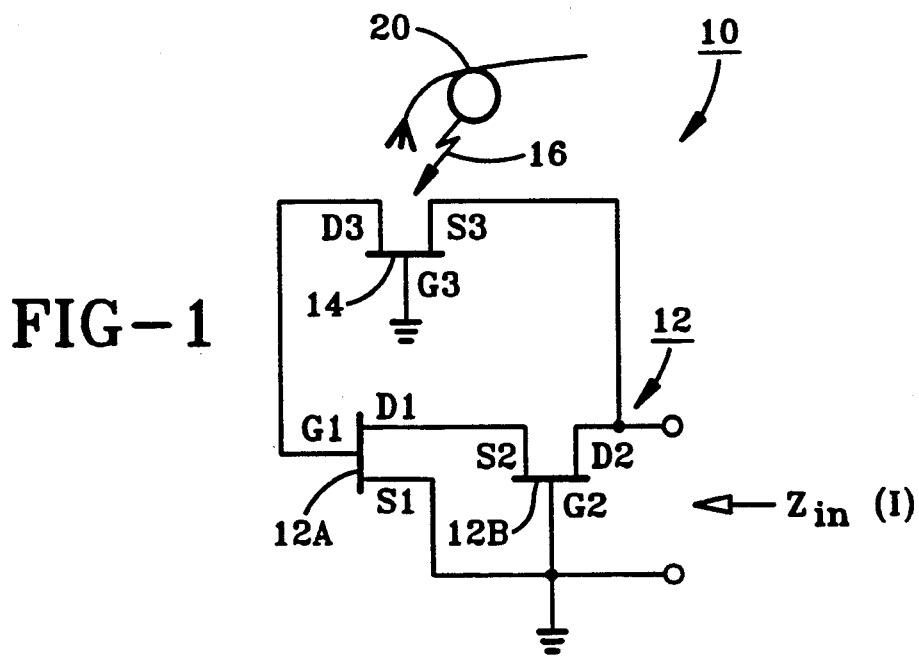
FIG. 1 is a schematic representation of an optically controlled active impedance element in accordance with one embodiment of the present invention.

A first embodiment of the optically controlled active impedance element 10 is shown in FIG. 1. The optically controlled impedance element 10 comprises a cascode arrangement 12 having a first (12A) and second transistor (12B). The cascode arrangement of transistors 12A and 12B serves as a high-input-impedance amplifier circuit having connect thereacross a feedback transistor 14. The first (12A), second (12B), and third (14) transistor devices are preferably of the field effect transistor (FET) type selected from the group consisting of the commonly identified semiconductor devices MESFET, BJT, HBT, and HEMT that are particularly suited for microwave applications. All of these transistors are responsive to incidence light serving as an optical signal.

The cascode arrangement of field-effect transistors 12A and 12B, has a grounded emitter input stage (12A) coupled directly to a grounded-control-electrode output stage (12B). The input and output stages are arranged in a well-known manner. More particularly, the input stage is connected to the drain electrode (D3) of feedback transistor 14 via the gate electrode (G1) of transistor 12A and the output stage is connected to the source electrode (S3) of feedback transistor 14 via the drain electrode (D2) of transistor 12B. The source electrode (S1) of transistor 12A, the gate electrode (G2) of transistor 12A, and the gate electrode (G3) of the feedback transistor 14 are all connected to ground potential.

The optically controlled active impedance element 10 has an input circuit impedance $Z_{in}$ which in the first embodiment of device 10 serving as an inductive element may be expressed by:

$$Z_{in}(I) \approx \frac{j\omega C_{gs}}{g_m g_{mf}(I)} \text{ for } \frac{\omega C_{gs}}{g_m}; \frac{\omega C_{gsf}(I)}{g_{mf}(I)} << 1 \qquad (1)$$

where:
  $C_{gs}$ = gate to source capacitance of each FET 12A and 12B in the cascode pair 12;
  $g_m$ = transconductance of each FET in the cascode pair 12;
  $g_{mf}(I)$ = transconductance of the illuminated feedback FET 14;
  $C_{gsf}(I)$ = gate to source capacitance of the illuminated FET 14; and
  (I) denotes dependence on optical intensity.

As seen from FIG. 1, the feedback transistor 14 is arranged so as to intercept the optical intensity 16, in the form of incident light, emitted from a fiber optic device 20. This optical device may be a 835 mm pigtail light emitting diode (LED) having a peak optical power of about 300 micro W. As seen from equation 1, optical intensity (I) intercepting the FET 14 is utilized by the present invention to effect the transconductance of the FET 14 and to provide for an optically tunable impedance element which serves as an active inductive element for various circuit applications. The internal photovoltaic effect is utilized to optically vary the feedback FET 14 by changing the gate to source bias of FET 14. The optically tuneable element 10 may be further described with reference to a discussion of an actual embodiment.

In the practice of the present invention, an optically controlled active inductive element 10 was constructed in a hybrid microwave integrated circuit (MIC) utilizing a NE25000 dual-gate FET for the cascode arrangement 12 and a NE71000 for the feedback FET 14. In order to conform the operating characteristics of device 10 to the input impedance $Z_{in}$ of equation (1), both devices (12A and 12B) in the dual-gate FET 12 were biased substantially identical and such biasing was accomplished in accordance with expression (2):

$$V_{gg2} = \frac{V_{DD}}{2} + V_{gg1} \qquad (2)$$

where:
  $V_{DD}$ = Dual Gate FET 12 Drain 2 (D2) to Source 1 (S1) voltage
  $V_{gg1}$ = Dual Gate FET 12 Gate 1 (G1) to Source 1 (S1) voltage
  $V_{gg2}$ = Dual Gate FET 12 Gate 2 (G2) to Source 1 (S1) voltage The bias conditions used in the experiment were $V_{DD}$=4v, $V_{gg1}$=−1.7V, and $V_{gg2}$=+0.3V for the dual-gate FET 12, which corresponded to a 7mA dual-gate FET 12 drain current, and $V_{DS}$=3V, and $V_{gs}$=−0.75V for the feedback FET 14 which corresponded to a 2mA feedback FET 14 drain current in the dark state, that is, it pinchoff region when the FET 14 is not being impinged by incident light 16. The operation of the optically controlled active inductive element may be further described with reference to FIGS. 2-5.

Figure 2:
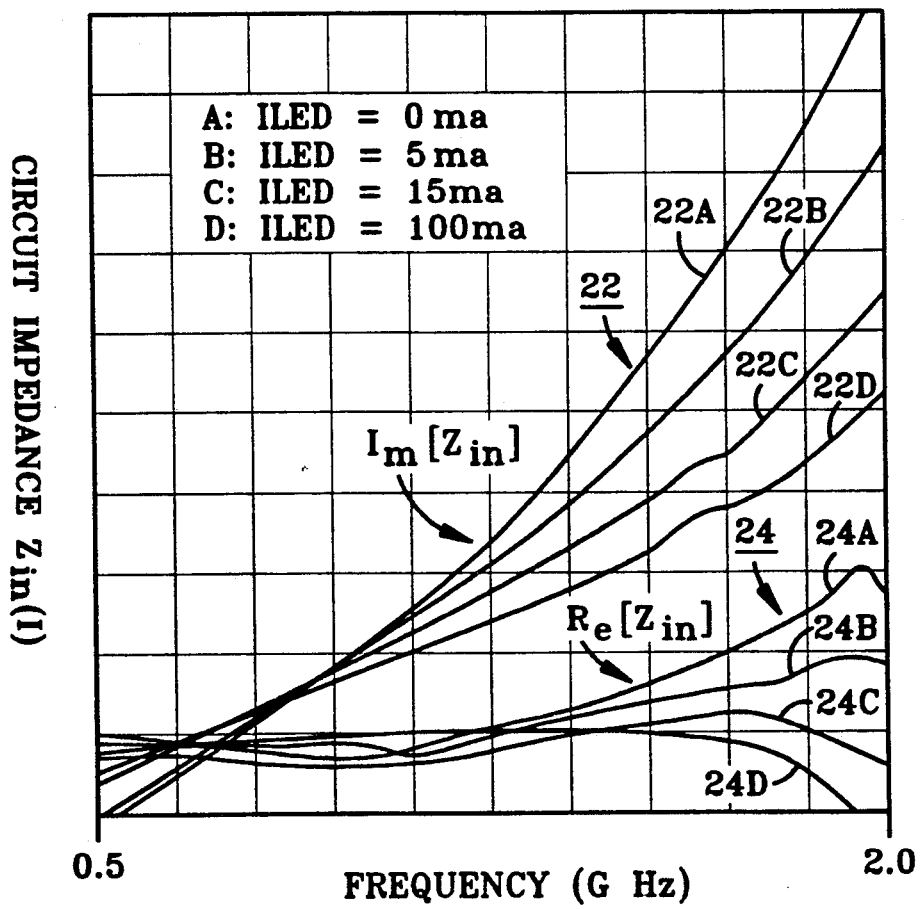
FIG. 2 illustrates the impedance vs. frequency response curves associated with the real and imaginary input impedance $Z\pm n$ of the embodiment of FIG. 1.

FIG. 2 illustrates the experimental results showing the real $R_e\{Z_{in}\}$ and imaginary $I_m\{Z_{in}\}$ parts of the input circuit impedance $Z_{in}$ (I) vs. frequency for four different illumination levels shown in FIG. 1 as being A: ILED=0mA; B: ILED=5mA; C: ILED=15mA; and D: ILED=100mA. The term "ILED" represents the current applies to the LED serving as the light source 20. FIG. 2 has an X coordinate given in frequency, (gigahertz (GH$_z$)) starting at 0.5 (GHz) and extending to 2.0 (GH$_z$) The Y coordinate of FIG. 2 is the circuit impedance Z$_{in}$ (I).

FIG. 2 has two plots 22 and 24, with the first plot indicative of the imaginary part, I$_m$ {Z$_{in}$} and the second plot 24 indicative of the real part R$_e$ {Z$_{in}$}. Each of the plots 22 and 24 are comprised of four sub-plots each having a letter subscript (A, B, C or D) respectively corresponding to the illumination level A, B, C or D. From FIG. 2, it is seen that the plot 24 of the real impedance is relatively constant except for the regions approaching 2 GH$_z$, whereas the plot 22 of the imaginary impedance is substantially comprised of linearly increasing functions. The input impedance Z$_{in}$ of FIG. 2 of the optically controlled element 10 operates so that its composite characteristic is inductive and may be further described with reference to FIG. 3.

Figure 3:
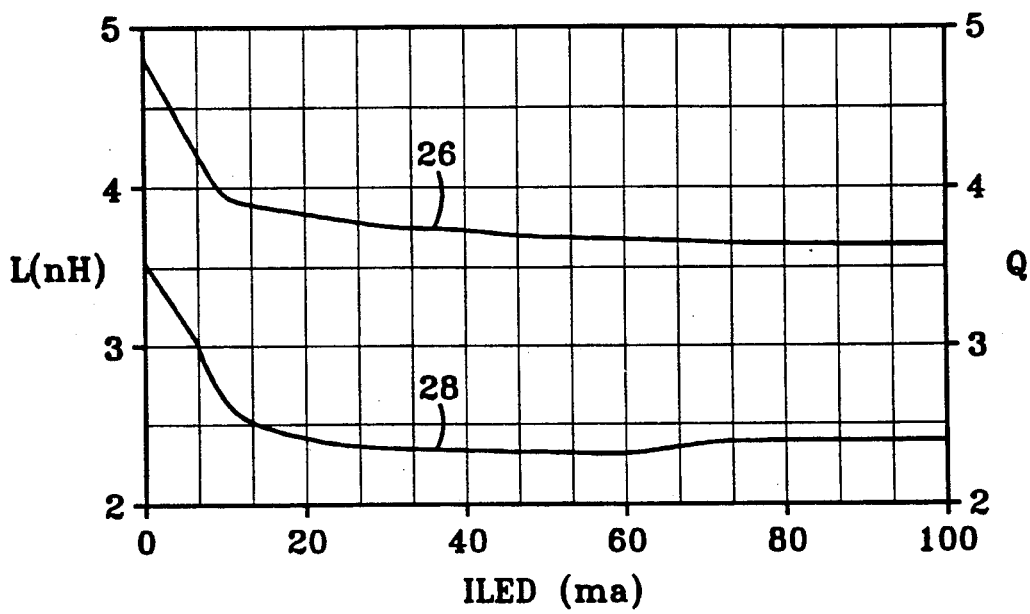
FIG. 3 illustrates the responses of the inductance and Q (figure of merit) vs. the current (ILED) of optical signal (LED) impinging the circuit arrangement of FIG. 1.

FIG. 3 shows respective plots of the conductance and Q vs. LED. FIG. 3 has an X coordinate plotted as a function of ILED given in mA, and first and second Y coordinates with the first showing the response of the inductance L, given in nH, and with the second showing the response of Q (figure of merit). The inductance L response is indicated by the plot 26, whereas, the Q response is indicated by the plot 28. The plots 26 and 28 are obtained in response to the adjustment of the ILED applied to the light source 20. More particularly, the incident light 16 that was delivered to the FET 14 by means of the optical device 20, shown in FIG. 1, was varied by adjusting the current applied to light emitting diode (LED), and the input impedance Z$_{in}$ (inductance L) and the Q of the circuit of FIG. 1, resulting from that incident light, are respectively shown by plots 26 and 28. The inductance and the associated Q, shown in FIG. 3, was measured as 1 GH$_z$. The resulting microwave performance was measured by a HP8510 network analyzer as a function of the LED current (ILED). In addition, the drain to source current (IDSF shown in FIG. 5, to be discussed), was monitored as the optical power 20 was being adjusted. A further response of the circuit of FIG. 1, is shown in FIG. 4.

Figure 4:
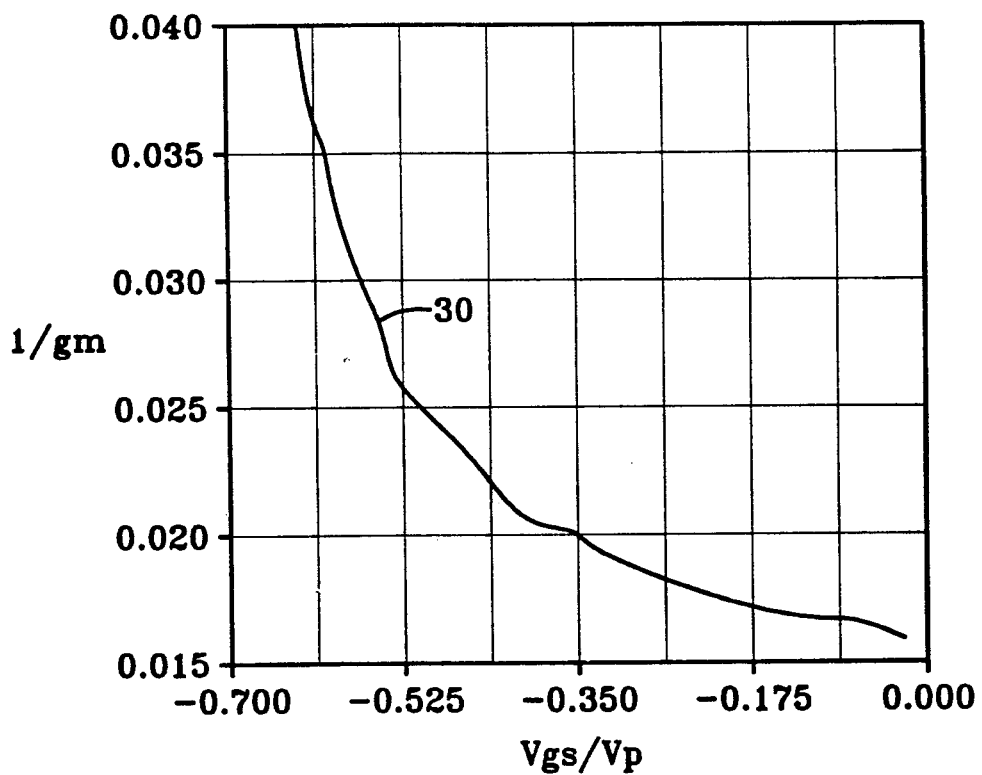
FIG. 4 illustrates another response $1/g_m$ vs. $V_{gs}/V_p$ of the circuit arrangement of FIG. 1.

FIG. 4 shows a plot of 1/gm (reciprocal of transconductance) vs. the feedback FET 14 normalized gate voltage V$_{gs}$/V$_p$ computed from the measured data of the NE71000 FET 14 device. The normalized gate voltage is shown along the X coordinate of FIG. 4, whereas the quantity 1/$_{gm}$ is shown along the Y coordinate of FIG. 4. The response of 1/$_{gm}$ to the adjustment of the V$_{gs}$/V$_p$ is shown by a plot 30 of FIG. 4. An additional response of a circuit arrangement of FIG. 1 is shown in FIG. 5.

Figure 5:
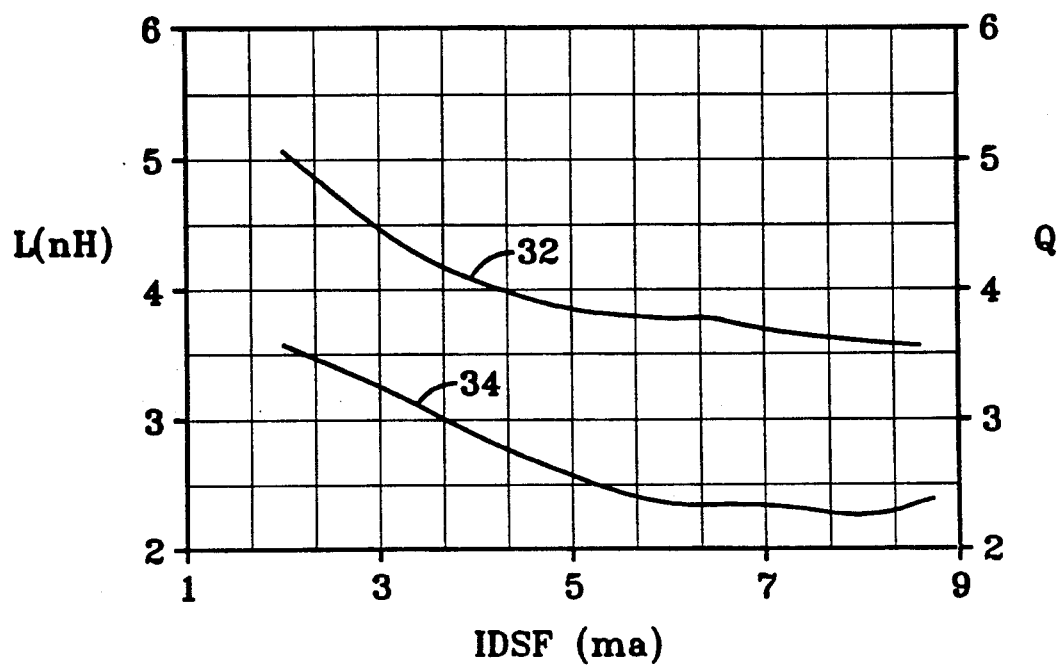
FIG. 5 illustrates the response of the inductance and Q (figure of merit) vs the drain-to-source current (IDSF) of the feedback transistor of the circuit arrangement of FIG. 1.

FIG. 5 is similar to FIG. 3, except that FIG. 5 illustrates the inductance and Q quantities responses vs. variations in the drain to source current (IDSF) of the feedback FET 14. FIG. 5 has an X coordinate shown by the quantity IDSF, given in ma, and a first Y coordinate showing the inductance L in nH, as well as a second Y coordinate showing figure of merit Q. FIG. 5 shows two plots 32 and 34 respectively of the responses of the L and Q quantities.

The primary features of the present invention is represented in the responses shown in FIGS. 3 and 5. More particularly, as seen from FIGS. 3 and 5, a 30% increase in inductance L, from approximately 5nH to approximately 3.5nH, is achieved by the direct optical illumination of the active inductive circuit 10 of FIG. 1. This increase in inductance L is used as a means to optically tune or adjust the frequency response of a microwave circuit in which the optically controlled active impedance element may find use. As further seen in FIGS. 3 and 5, most of the tuning is achieved with small amounts of optical power, that is, the lower current regions (ILED of FIG. 3 and IDSF of FIG. 5) include the majority of the inductance L changes. Further as seen in FIGS. 3 and 5, the associated Q of an optical controlled active inductive element 10 is fairly low. However, this relatively low figure of merit Q may be easily compensated for in microwave circuit applications by providing a constant negative resistance in the circuit in which element 10 is being used. The constant negative resistance is allowable because, as seen in FIG. 2, the real part (plot 24) of the inductive impedance remains fairly constant over the majority of the frequency range of FIG. 2.

It should now be appreciated, that the practice of the present invention, provides an active feedback circuit 10 requiring relatively low optical power to cause it to change its inductance characteristic over a relatively large frequency range. Still further, it should be appreciated that the practice of the present invention provides for an active element that allows for a 30% range in its inductive value so as to provide a frequency variable quantity to create the means to provide for wide band frequency tuning.

Figure 6:
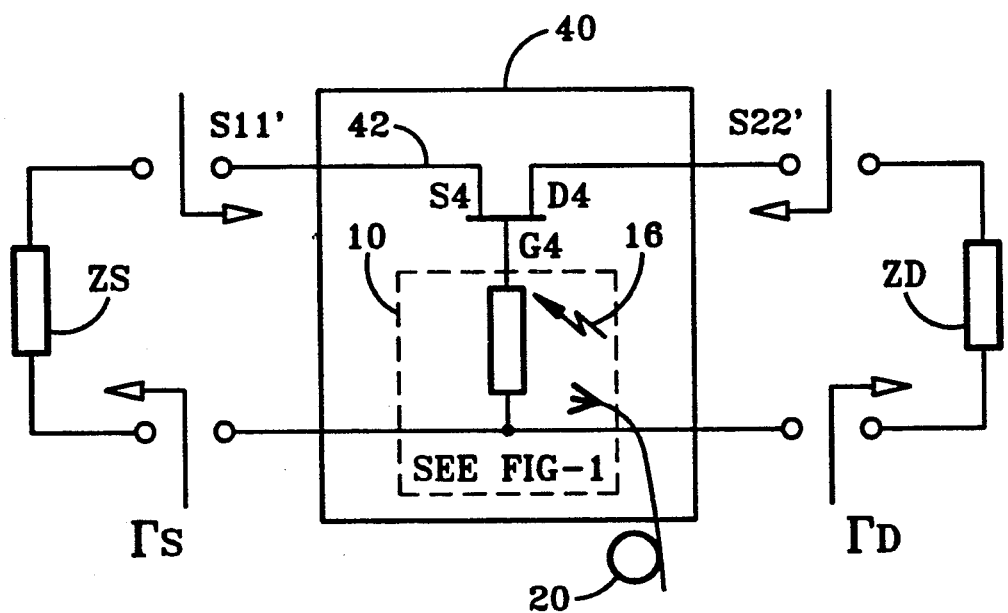
FIG. 6 illustrates a block diagram of a two-port negative resistance oscillator utilizing the optically controlled active device of FIG. 1.

One of the applications that the circuit embodiment of FIG. 1 is particularly suited for is a microwave oscillating circuit, such as shown in FIG. 6. FIG. 6 shows a block diagram of a two-port negative resistance oscillator 40, utilizing the optical controlled active impedance element 10 that is impinged by the incident light 16, generated by the fiber optic device 20 previously discussed. The oscillator 40 requires an inductive series feedback, provided by element 10, to obtain negative resistance in this two-port common gate configuration shown in FIG. 6. The two-port negative resistance device 40 is interconnected between a passive drain load ZD and a passive source load ZS. The oscillator 40, in addition to the optical controlled active impedance element 10, further comprises a fourth transistor 42 which is preferably the type of semiconductor device previously given, discussed for transistors 12A, 12B and 14.

The fourth transistor has an input and output stage with its input stage connected to the output stage of device 10 by having a connection between the gate electrode (G4) of the fourth transistor to the drain electrode (D2) of transistor 12B. The fourth transistor generates an output signal, available across electrodes D4 and S4, in response to the signal applied to its input stage (G4). The steady state oscillation conditions for the circuit of FIG. 6 is given by expressions 3 and 4 below:

$$\Gamma_S S_{11} = 1 \quad (3)$$

$$\Gamma_D S_{22} = 1 \quad (4)$$

where:
$\Gamma_S$ = reflection coefficient (shown in FIG. 6) for the source (S4) to gate (G4) load
$\Gamma_D$ = reflection coefficient (shown in FIG. 6) for the drain (D4) to gate (G4) load Since the oscillation condition of oscillator 40 is dependant on the instantaneous value of the feedback impedance provided by the optical tuned device 10, pulsed operations may be obtained by appropriate tuning of the optical controlled active inductor 10 to alternatively create and destroy the negative resistance condition needed to sustain oscillation. Furthermore, since the oscillator operating frequency is determined by the value of the feedback impedance provided by device 10, frequency tuning may be accomplished by optically tuning the active feedback element 10.

Figure 7:
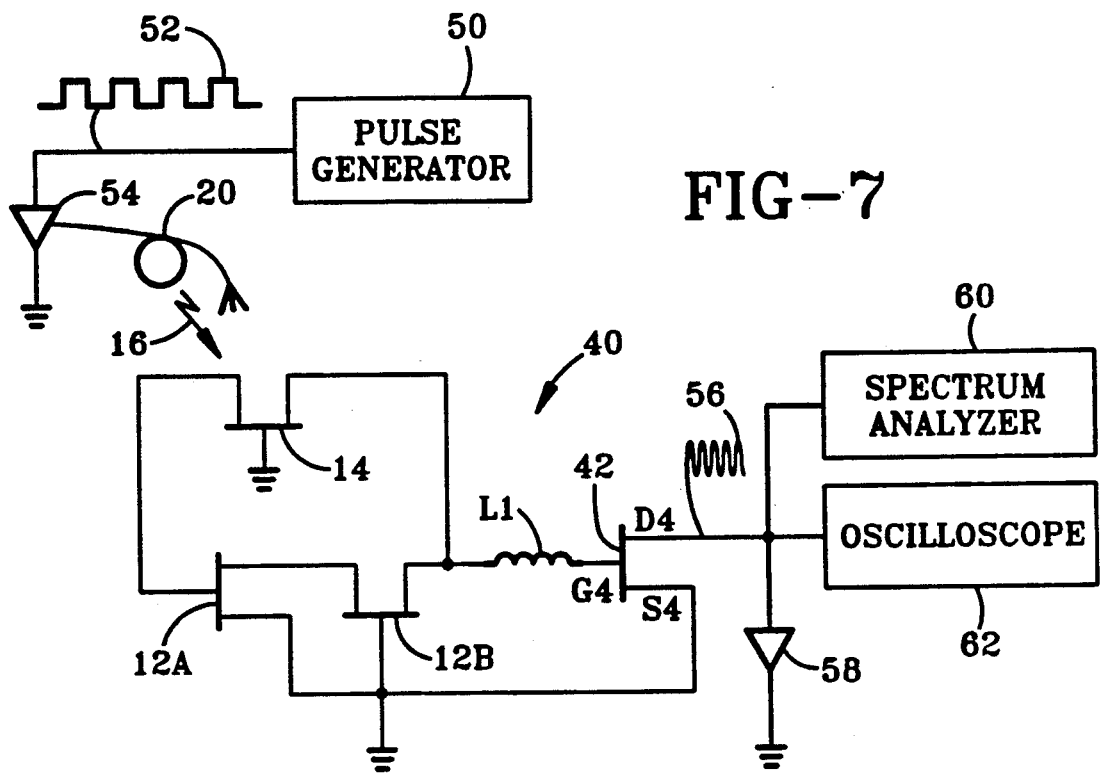
FIG. 7 illustrates an experimental set-up of the oscillator of FIG. 6 used in a pulse modulation application.

In accordance with practice to the present invention, an optically controlled oscillator 40, shown in FIG. 7, was built in a hybrid microwave integrated circuit (MIC) construction on a 1"× 1" hybrid alumina substrate utilizing a NE25000 dual-gate FED for the active inductive cascode pair 12, an NE71000 FET for the active conductive feedback FET 14, and an NE72000 for the common gate oscillator FET 42. As shown in FIG. 7, an inductive L1 was arranged in a serial manner with the active inductive element 10. The inductor L1 was selected to have a fixed value of 13nH and was arranged in a serial manner with the active inductive element which was operated to provide an active inductive value of 5nH, so as to provide a total value of 18nH of inductive feedback which, in turn, allowed for a 1.67 GHz operation of the oscillator 40.

A 835 mm pigtail light emitting diode (LED), serving as light source 20 and yielding the optical intensity 16, was positioned over the NE71000 FET 14 by means of a micropositioner and was modulated with a pulse generator 50 to provide the optical tuning. The pulse generator 50 generated a signal 52 having a 12 microsecond pulse with an associated duty cycle of 20% and was used for the LED modulated signal 52. The signal 52 was applied to the pigtail LED 20 by means of a drive device 54. The NE71000 FET 14 was biased in its pinch-off region int he dark state (previously discussed with reference to FIG. 1) which destroys or renders inoperative the active inductance 10, as well as the steady state oscillations. The pulse generated signal 52 was adjusted to provide enough LED power to tune (active) the active inductance 10 so as to provide approximately 5nH for the duration (on-time) of the light pulse signal 52. This value of inductance (5nH) allowed the oscillator 40 to generate oscillations, and did so, with only 30 micro W of peak optical power. An external amplifier (not shown in FIG. 7) with a 15 dB gain was used to amplify the oscillator output power to a value of 1 milli W.

The oscillator 42 generated a signal envelope 56, and a crystal detector 58, spectrum analyzer 60 and an oscilloscope 62 were used to analyze the quality of that signal 56. The measurement of the signal envelope 56 determined it to have a 10–90% rise time of 97 microseconds and a fall time of 295n seconds. These values, in particular, the fall time of 295ns represent a significant improvement over prior art oscillators commonly having the fall times in the millisecond range created by the relatively long excess carrier lifetime associated with traps in the devices themselves, such as MESFETs.

The results obtained from the experimental set-up FIG. 7, showed that the oscillator 40, in particular, the active inductor element 10, when having its operating points selected near the boundary of the negative resistance region, requires only a small change in the series feedback inductance, produced by element 10, to switch between the oscillation and the stable regions of the oscillator circuit 40. Therefore, the use of the optically controlled active impedance element 10 serving as an optically tuned inductive device, improves the speed of response of microwave circuits, such as the oscillator 40 of FIGS. 6 and 7.

It should now be appreciated, that the practice of the present invention, provides an optically controlled impedance element used for an oscillating circuit having a improved frequency response and also having a reduced optical power requirements.

Figure 8:
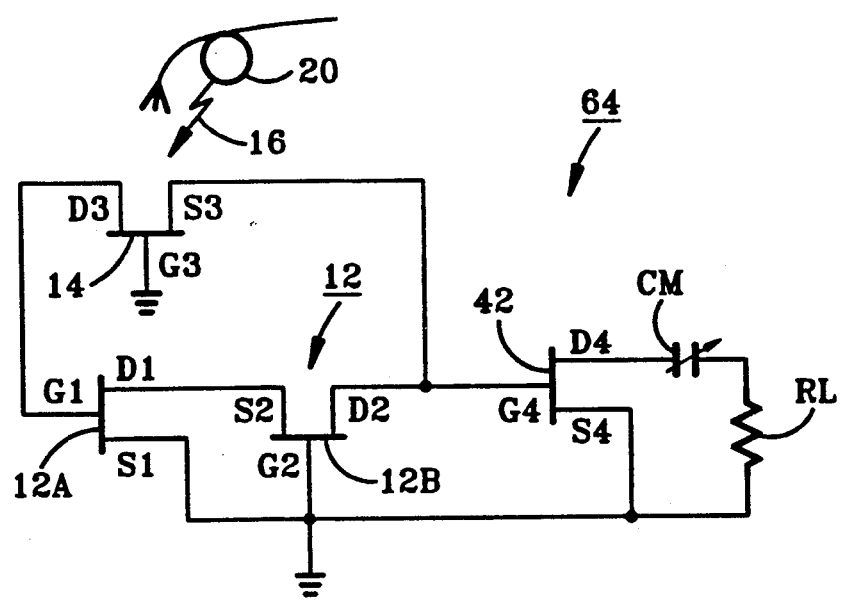
FIG. 8 is a schematic of a circuit arrangement particularly suited for a monolithic microwave integrated circuit (MMIC)

The circuit arrangement of FIG. 7 was of a hybrid microwave circuit; however, the practice of the present invention is particularly suited to provide a monolithic microwave integrated circuit (MMIC) such as shown in FIG. 8. The circuit of FIG. 8 utilizes MESFET based technology for the first (12A), second (12B), third (14) and fourth (42) transistor devices. These MESFET devices are optically sensitive and provide the means to optically tune the microwave circuit, while at the same time are compatible to be integrated into a MMIC chip.

The present invention by utilizing the feedback FET 14 to respond to the optical signal, avoids the prior art problems yielded by the application of an optical signal to MESFET type devices that simultaneously cause changes in the transconductance and capacitive properties of the MESFET devices that, as previously discussed in the "Background" section, cause the circuits, having such devices, to disadvantageously experience power variations while optical tuning is being accomplished. The present invention by focussing the optical signal on the feedback FET, avoids such problems, while at the same time allows MESFET devices to be used for MMIC applications, such as the microwave circuit shown in FIG. 8. The two-port negative resistance oscillator 40 shown in FIG. 8, has a variable capacitor CM connected between the drain (D4) electrode of the fourth transitive device 42 and a resistive load RL.

It should now be appreciated that the practice of the present invention provides for a optically controlled active impedance element 10 that is particularly suited for MMIC applications.

The present invention has an additional mode of operation which may be described with reference to FIG. 1. The additional mode may be obtained by operating all of the active devices (12A, 12B and 14) in the cutoff mode. For this additional mode, the circuit input impedance $Z_{in}$ is capacitive rather than inductive and is given by equation 5:

$$Z_{in}(I) \approx \frac{1}{j\omega C_{gs}(I)} \quad (5)$$

where:

$C_{gs}(I)$ = gate to source capacitance of the illuminated feedback FET 14

For this additional mode, the illumination from the optical source 20 is positioned so as to intercept the entire circuit 10 and can be used to switch the circuit impedance between the inductive and capacitive states. Furthermore, the specific value of inductance or capacitance may be optically tuned by the appropriate selection of electrically and optically bias points in a manner as previously discussed for FIGS. 1–5. This type of operation may be useful for several applications including switched filters and high-pass/low-pass phase shifters. A high-pass filter circuit employing the principles of the additional mode of operation of the circuit of FIG. 1, is shown in FIG. 9.

Figure 9:
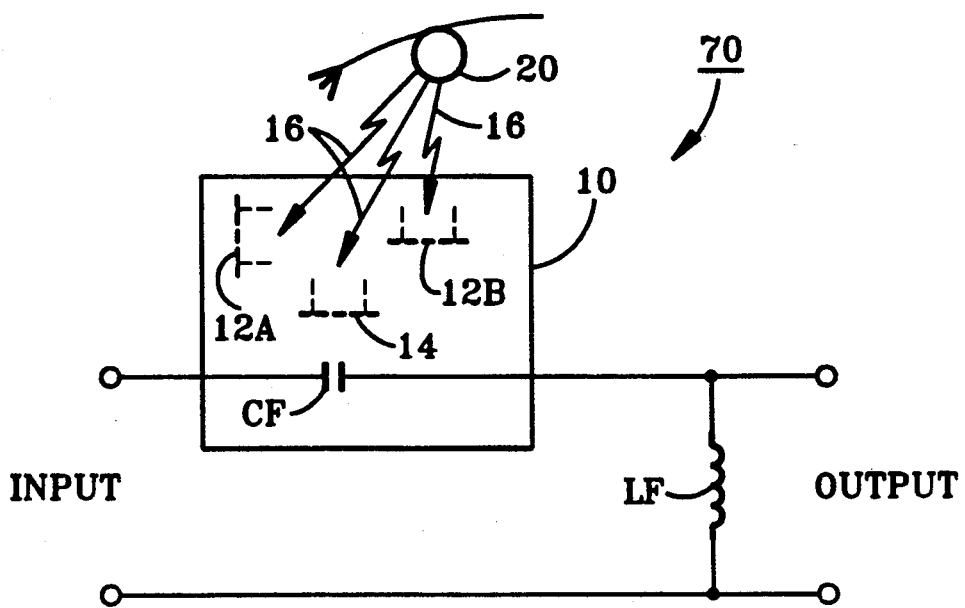
FIG. 9 illustrates a high-pass filter employing the principles of the present invention.

FIG. 9 shows (in phantom) all of the first, second and third transistors (12A, 12B and 14) as being impinged by the illumination intensity signal 16 transmitted from the optical source 20, such as a modulated LED device 20 previously discussed with regard to FIG. 7. The overall effect is to provide an optically tuned impedance device 10 that act as a capacitive element CF, shown in FIG. 9, and forms part of a high-pass filter 70. The high-pass filter 70 functions in a known manner so that the frequency signals, below a specified cut-off value, that are applied to the input stage of circuit 70, are eliminated by the circuit so as not to present at the output stage of the circuit 70. The capacitive element CF is in series with the load (connected to the output terminals of circuit 70), and an inductive element LF of circuit 70 is connected across the same load.

A circuit arrangement of an optically controlled active impedance element 10 acting as an inductive device, in a manner as previously described with reference to FIGS. 2-5, may be utilized for a low-pass filter 80, shown in FIG. 10. The circuit of FIG. 10 employs the optical controlled active impedance element 10 that is operated in its pinchoff mode with the light source 20 being positioned so that its transmitted light 16 intercepts FET 14.

Figure 10:
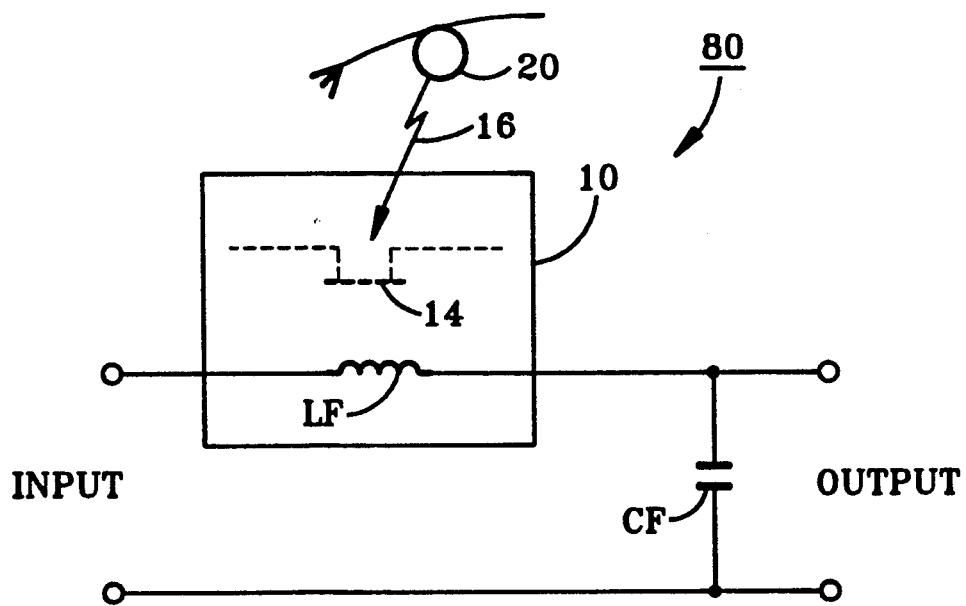
FIG. 10 illustrates a low-pass filter employing the principles of the present invention.

As previously discussed, such an operation causes the element 10 to perform as an impedance element LF, which is shown in FIG. 10. The low-pass filter 80 of FIG. 10, eliminates undesirable high-frequency components that are applied to the input terminals of the circuit so that these high frequency components are not present at the output stage of circuit 80. The inductance LF is placed in series with the load, whereas the capacitor element CF is placed in parallel with the load.

It should now be appreciated that the practice of the present invention provides for an optically controlled active element that serves as either an active inductive element or an active capacitive element used for various microwave circuits, such as low-pass and high-pass filters.

Many modifications and variations of the present invention are possible in view of the above disclosure. It is therefore to be understood, that within the scope of the appendix claims, the invention may be practiced otherwise than specifically described.

What we claim is:

1. An optically controlled oscillator comprising:
   (a) a cascode arrangement of first and second transistor devices having an input and an output stage;
   (b) a third transistor device responsive to an optical signal generated from an optical source having an adjustable light intensity, said third transistor arranged as a feedback element between said input and output stages; and
   (c) a fourth transistor having input and output stages, the input stage of said fourth transistor connected to the output stage of said first and second transistor, said fourth transistor generating an output signal in response to a signal applied to its input stage.

2. An optically responsive oscillator according to claim 1, wherein said first, second, third, and fourth transistor devices are of the field effect transistor (FET) type selected from the group consisting of MESFET, BJT, HBT and HEMT semiconductor devices particularly suited for microwave applications.

3. The optically responsive oscillator according to claim 1, wherein said first and second FETS are operated with each having substantial the same bias condition.

4. An optically responsive oscillator according to claim 3, wherein said feedback FET is operated in its pinchoff region and positioned to be impinged by incident light generated by said light source, said optically controlled active impedance element being operated so as to act as an inductive element.

5. An optically responsive oscillator according to claim 2, wherein said first, second and third FETs are all operated in their cutoff mode and all of said FETs are positioned so as to be impinged by incident light generated by said optical source, said light source causing said optically controlled active impedance element to be operated so as to act as an inductive element.

6. An optically responsive oscillator according to claim 1, wherein said optical signal generated by said optical source is a pulsed type.

* * * * *